Figure 1:
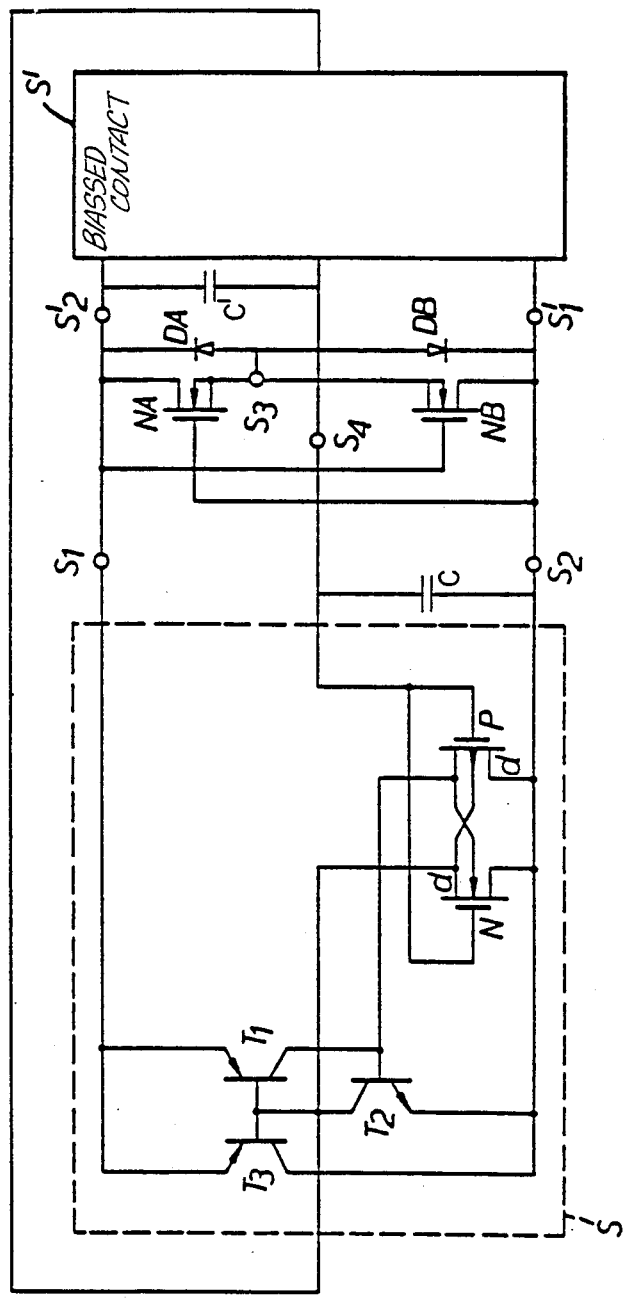

United States Patent [19]

Remmerie et al.

[11] Patent Number: 4,821,315
[45] Date of Patent: Apr. 11, 1989

[54] ELECTRONIC CONTACTS AND ASSOCIATED DEVICES

[75] Inventors: Guido P. T. C. Remmerie, Rumst; Luc J. L. Van den Bossche, Lebbeke, both of Belgium

[73] Assignee: Alcatel N.V., Amsterdam, Netherlands

[21] Appl. No.: 732,789

[22] PCT Filed: Sep. 13, 1984

[86] PCT No.: PCT/EP84/00282
§ 371 Date: May 6, 1985
§ 102(e) Date: May 6, 1985

[87] PCT Pub. No.: WO85/01404
PCT Pub. Date: Mar. 28, 1985

[30] Foreign Application Priority Data

Sep. 19, 1983 [BE] Belgium .................... 2/60208
Aug. 22, 1984 [EP] European Pat. Off. ......... 84201211

[51] Int. Cl.$^4$ .................... H04B 3/00; H03K 17/00
[52] U.S. Cl. .................... 379/412; 361/119; 361/193; 307/544; 307/257
[58] Field of Search .............. 307/236, 254, 255, 363, 307/502, 571, 570, 296 R, 257, 544; 361/245, 246, 193, 119, 56, 91; 320/25, 26; 179/16 AA:18 FA; 379/338, 344, 399, 412, 365, 400, 398; 368/201, 200; 375/7; 340/347 DD, 825.57

[56] References Cited

U.S. PATENT DOCUMENTS

| | | | |
|---|---|---|---|
| 3,284,794 | 11/1966 | Bean | 307/502 X |
| 3,778,641 | 12/1973 | Persson | 307/255 |
| 3,928,789 | 12/1975 | Elias | 361/193 |
| 3,931,481 | 1/1976 | Jackson | 361/193 X |
| 4,074,081 | 2/1978 | Humm | 379/387 X |
| 4,170,740 | 10/1979 | Pernyeszi | 379/387 X |
| 4,280,069 | 7/1981 | Kompelien | 307/571 |
| 4,319,144 | 3/1982 | King et al. | 307/236 |
| 4,323,799 | 4/1982 | King et al. | 307/571 |
| 4,348,669 | 9/1982 | Braun | 340/825.58 |
| 4,469,915 | 9/1984 | Lax et al. | 379/74 |
| 4,473,303 | 9/1984 | Suzuki | 368/201 |
| 4,482,818 | 11/1984 | Ryczek et al. | 307/257 |
| 4,507,525 | 3/1985 | Siligoni et al. | 379/412 |
| 4,511,809 | 4/1985 | Allen | 307/254 |
| 4,535,203 | 8/1985 | Jenkins et al. | 307/257 |

FOREIGN PATENT DOCUMENTS

| | | |
|---|---|---|
| 1164046 | 3/1984 | Canada . |
| 1210059 | 8/1986 | Canada . |
| 3015114 | 10/1981 | Fed. Rep. of Germany ...... 379/399 |

OTHER PUBLICATIONS

Abstract European Patent 65346, 11-1982.
Official Gazette of the P.T.O., 4,575,642, Mar. 11, 1986, p. 852.
Official Gazette of the P.T.O., 4,357,544, Nov. 2, 1982, pp. 320-321.

Primary Examiner—Jin F. Ng
Assistant Examiner—Randall S. Vaas
Attorney, Agent, or Firm—Christie, Parker & Hale

[57] ABSTRACT

High voltage electronic contacts (S, S') and associated devices including TRIMOS (MOS TRIacs) devices connected in anti-parallel fashion between two terminals ($S_1/S'_2$, $S_2/S'_1$). Each electronic contact (S, S') is controlled via a control terminal ($S_4$) by two auxiliary electronic contacts (NA, NB) each able to establish a low or high impedance between the control terminal ($S_4$) and one of the two other terminals ($S_1/S'_2$, $S_2/S'_1$), the impedance conditions of these auxiliary contacts (NA, NB) being opposed. A power protection circuit associated to the TRIMOS device allows the flow of a relatively high current through the electronic contacts (S, S') for the lower voltage range across it, and minimizes the power dissipation in the contacts in the higher voltage range, i.e. when abnormally high signals are applied to the contact.

30 Claims, 8 Drawing Sheets

ELECTRONIC CONTACTS AND ASSOCIATED DEVICES

The invention relates to electronic contacts enabling to establish a low or high impedance between a first and a second terminal under the control of a circuit providing a control signal between a third and a fourth terminal.

Such electronic contacts are for instance used in the Belgian Pat. No. 896,388 particularly relating to a controlled capacitive charge circuit enabling to positively or negatively charge a capacitance which, in accordance with the sign of this charge, opens or closes an electronic contact constituted by two DMOS transistors in series opposition, in such a way that their drains respectively constitute the two terminals of the electronic contact while their sources are each tied to the same terminal of the capacitance and their gates both connected to the other terminal of the capacitance, with the possibility for this last to be constituted by the parasitic capacitance between these paired terminals. In such a way, by using transistors able to withstand relatively high voltages, one obtains an electronic contact which can be inserted in a circuit where one or the other polarity may appear at the contact terminals. Indeed, when the polarity of the charge on the control capacitance for the contact is such that it does not offer a low resistance path, i.e. that the two transistors are blocked, the parasitic diodes which appear for this transistor state between the source and the drain are thus connected also in series opposition which maintains a high impedance whatever the polarity applied by the circuit in which the contact is inserted.

One of the objects of the present invention is to enable the use of a more advantageous type of electronic contact able also to be controlled by the polarity of the charge of a capacitance, and particularly thyristor type device able to work with high breakdown voltages (300 Volts for instance) as envisaged in the above mentioned patent but which can only pass current in one direction while they can block voltages of one or the other polarity, the transistors of the above mentioned patent having inverse properties, i.e. they can conduct the current in one or the other direction but block only one voltage polarity.

The general object of the present invention is to enable the use of such electronic contacts while avoiding a complication of the control circuit.

In accordance with a first characteristic of the invention, the electronic contact defined above is characterized in that two auxiliary electronic contacts are foreseen and enable to establish a low or high impedance between the first and the third terminals and between the second and the third terminals, the impedance conditions of these two auxiliary contacts being opposed.

Such an arrangement offers the advantage that two electronic contacts of the thyristor type can be connected top against bottom as a triac and controlled with the help of the same control circuit and particularly that of the above mentioned patent using a positive or negative charge for a capacitance to close or open the electronic contact. Indeed, with the help of the auxiliary electronic contacts, in accordance with the polarity of the voltage applied to the terminals of the electronic contact constituted by the two biassed contacts connected in shunt opposition, it will automatically be possible to obtain a connection between a terminal of the control capacitance and the terminal of the main electronic contact having a given polarity. In this manner, the same capacitance charge circuit, i.e. the voltage doubler AC/DC converter described in the above mentioned patent, shall always be used to close or open that of the two polarized contacts which is effectively inserted in a load circuit and depending upon the polarity of the voltage appearing at the terminals of these contacts connected in shunt opposition.

On the other hand, the advantage of thyristor electronic contacts able to be controlled in the indicated manner, and with respect ot the DMOS transistors connected in series opposition as in the above mentioned Belgian patent, instead of the top against bottom connection proposed, is that the resistance for the closed condition of the contact is distinctly lower, i.e. below 10 ohms instead of $25+25=50$ ohms. Moreover, for the thyristor solution, the necessary surface in an integrated circuit is reduced to one quarter.

The present invention also relates to an electronic device forming part of a circuit including also a power source and a load, said device including means to limit the power dissipation therein.

Such a device is already known, e.g. from the PCT patent application WO 82/03733. Therein the power limiting means are designed to produce a current versus voltage or I/V characteristic which, starting from the origin, rises to a maximum current at a predetermined voltage, remains on that current until a maximum voltage is reached and then suddenly drops to a current substantially equal to zero. At the last breakpoint of this characteristic the power dissipated in the device is maximum (maximum current and voltage) and in some circumstances this may be inadmissible, e.g. in case the device is to be integrated in an electronic chip.

An object of the present invention is to provide an electronic device of the above type, but having a reduced power dissipation.

This object is achieved due to the fact that said power limiting means are designed to produce a current versus voltage characteristic for the device which, starting from the origin, crosses the load line of the device and thereafter tends to follow said load line towards the voltage axis without again crossing the load line defined by the short-circuit current through the device and the open-circuit voltage across it.

The minimum of power dissipated in the device occurs in the working point thereof, i.e. the point where the I/V characteristic crosses the load line. Unwanted abnormal signals having various origins like lightning striking such a telephone circuit or main power supply accidentally connected to it could affect the characteristics of the circuit. Indeed, such signals are added to the normal signals generated by the power source so that the position of the load line is modified. The working point then moves along the part of the I/V characteristic crossing the load line. In case these unwanted abnormal signals become very large, the load line could be displaced in such a way that the working point reaches the upper end of that part of the I/V characteristic. This working point then becomes unstable and moves to higher voltages. Since the I/V characteristic then follows the load line the power dissipated in the device during this transition of the working point is reduced to a minimum. When the unwanted abnormal signals disappear the load line returns to the position initially mentioned and due to the fact that the part of the I/V characteristic following the load line does not cross the latter, the working point moves from the higher voltages to its initial position. This would not be the same if there was a crossing between that part of the I/V characteristic and the load line. Indeed, such crossing would create a working point distinct from the one mentioned above and affect the normal working of the electronic device.

Another object of the present invention is to allow, for relatively small voltages, currents which are much larger than the short-circuit current to flow through the electronic device while keeping the advantages mentioned above for higher voltages.

This object is achieved due to the fact that the part of said current versus voltage characteristic crossing said load line has a first portion extending, for voltages which are relatively much smaller than said open circuit voltage, to a current relatively much larger than said short-circuit current and a second portion joining said first portion to the part of the characteristic which follows the load line.

The working point of the device may thus move along the first portion of the I/V characteristic so that the current in this device may reach said relatively large value for small voltages without activating the power limiting means. For higher voltage values the device operates as described above.

Another object of the present invention is also to use such electronic contacts in telecommunication systems and particularly in telephone line circuits, in order to enable the accomplishment of various supervision and control operations, including the provision of a ringing current, functions which previously were generally accomplished by means of relay contacts even in central exchanges where the rest of the equipment was electronic.

Thus, the invention is also related to a telecommunication system line circuit comprising a series impedance in each of the two line conductors and contacts on each side of these two impedance enabling to selectively connect their terminals towards the exchange or the line respectively or alternatively, towards auxiliary circuits.

Such a system is to be found for instance in the article published on pages 316 to 324 of the IEEE Journal of Solid State Circuits of June 1983, and more particularly on page 317. It is seen there that the two series resistances serve to feed a telephone subscriber line and also to measure the voltage appearing across these resistances and this for supervision and control operations. On the exchange side of these resistors, a ringing current can be injected by means of the corresponding contacts and by measuring the voltages across the resistances one may thus supervise the ringing operation. On the other hand, on the other side of these resistors, the contacts on the side of the subscriber line enable to have access to busses to perform tests, either internal (towards the exchange and through the series resistors) or external towards the subscriber line. Until now, these contacts were generally realized by means of change over contacts of three relays which automatically implied that when the make part of the contact was closed in shunt towards one of the control circuits, the break part in series with one of the resistors was automatically open and vice versa.

In accordance with another characteristic of the invention, these contacts are constituted by four pairs of electronic contacts, the first connecting the line to the impedances, the second connecting these to the exchange, the third connecting the impedances on the line side to a first auxiliary circuit and the fourth connecting them on the exchange side to a second auxiliary circuit.

In accordance with yet another characteristic of the invention, only the first pair of electronic contacts is provided with power limiting means such as described above.

In accordance with an additional characteristic of the invention, the eight electronic contacts which are always operated in pairs are additionally controlled in such a way that only eight combinations among the sixteen possible for the four pairs are permitted.

In accordance with yet another supplementary characteristic of the invention, the control device of the four pairs of electronic contacts comprises a decoder able to be fed by three binary signals in parallel and providing four binary output signals to control the four pairs of electronic contacts, a binary selection circuit being additionally foreseen to enable or inhibit the decoder outputs and in this last case enable connections permitting to the four input signals to respectively control the four pairs of electronic contacts.

In this manner, it becomes possible in particular to realize in the form of a single integrated circuit, not only a series of eight electronic contacts able to withstand relatively high tensions and operating in pairs, but also to control the operation of these electronic contacts either with the help of a code comprising only three binary elements, or directly by a signal corresponding to the pairs of electronic contacts. This versatility can yet be increased by the incorporation in such an electronic circuit of a clock enabling to operate the control circuits of the electronic contacts in a manner described in the above mentioned patent and thus avoiding to rely on a separate clock circuit.

Figure 2:
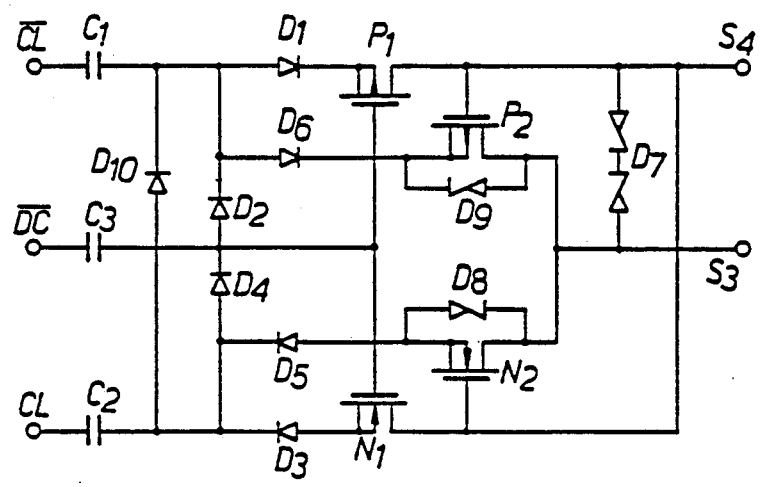
Figure 9:
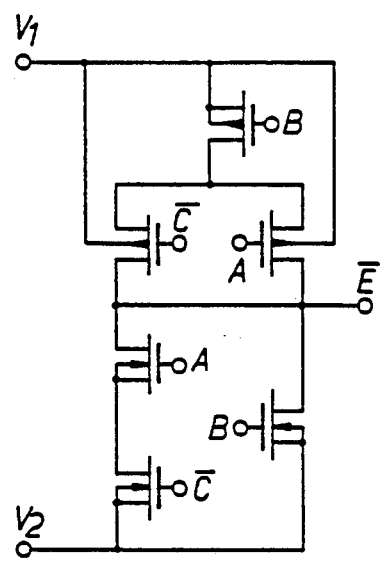
Figure 10:
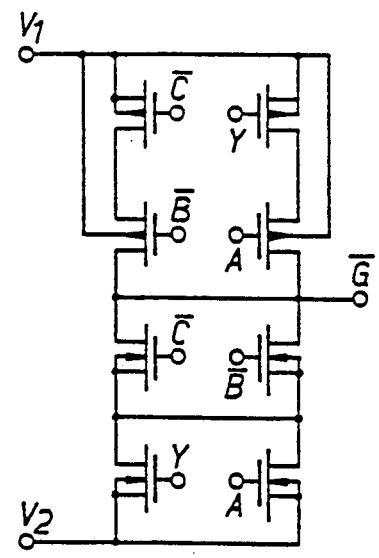
Figure 3:
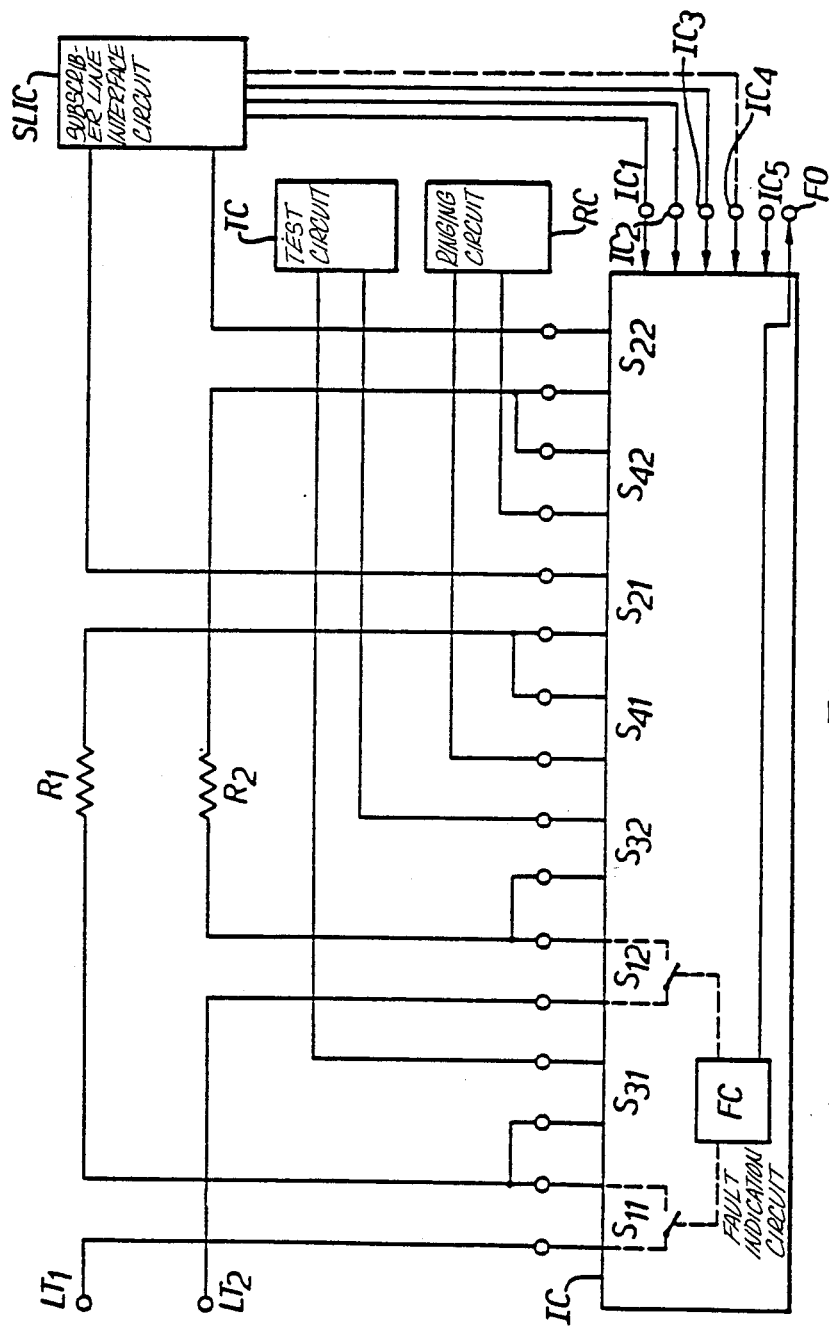
Figure 4:
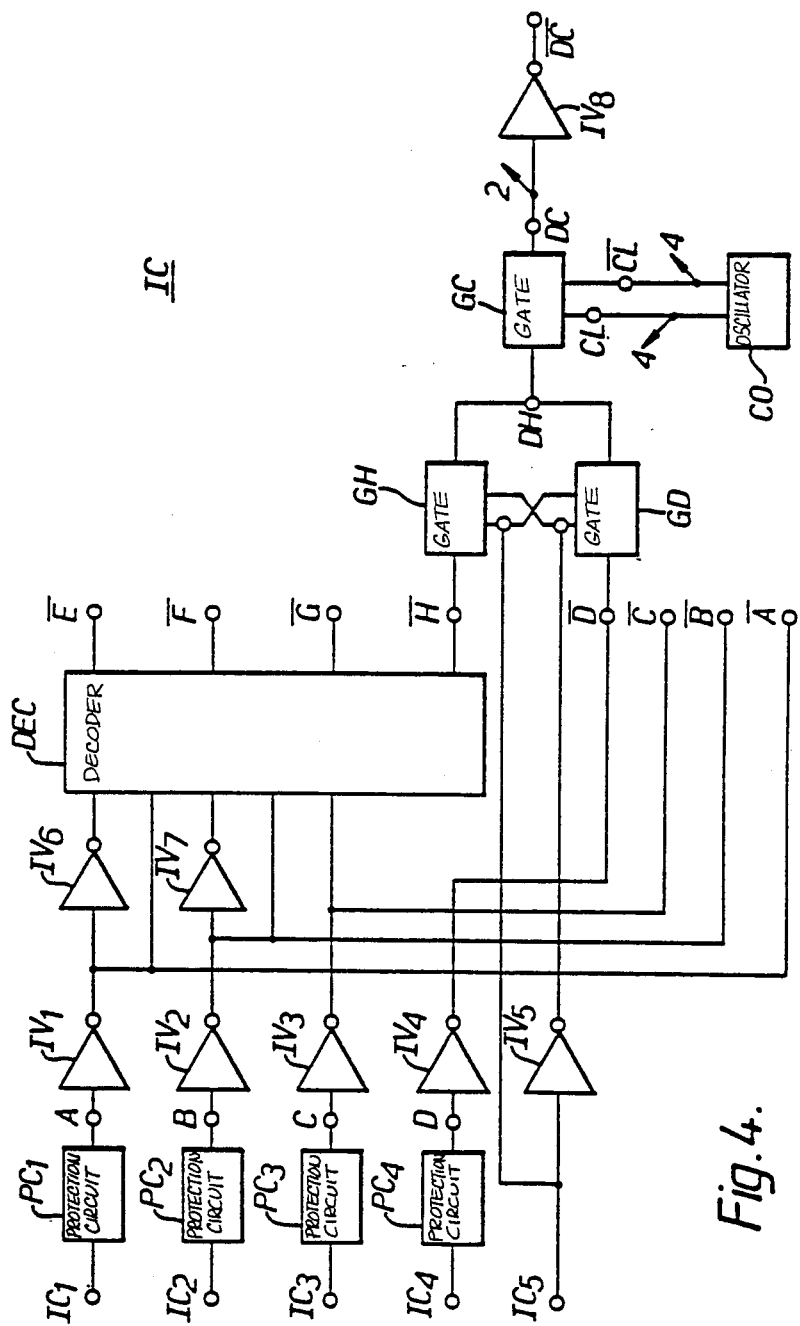
Figure 5:
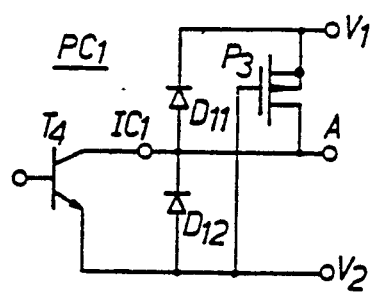
Figure 6:
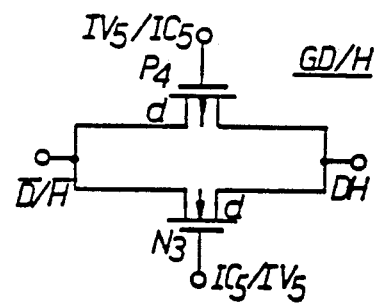
Figure 7:
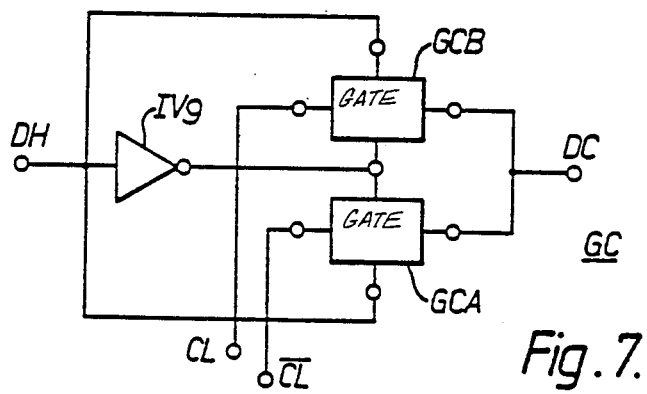
Figure 8:
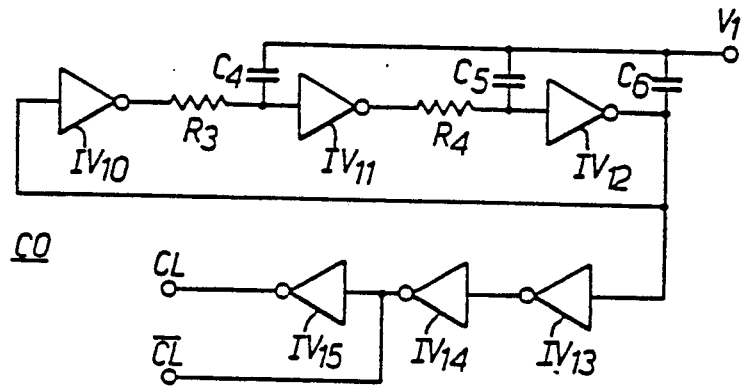
Figure 11:
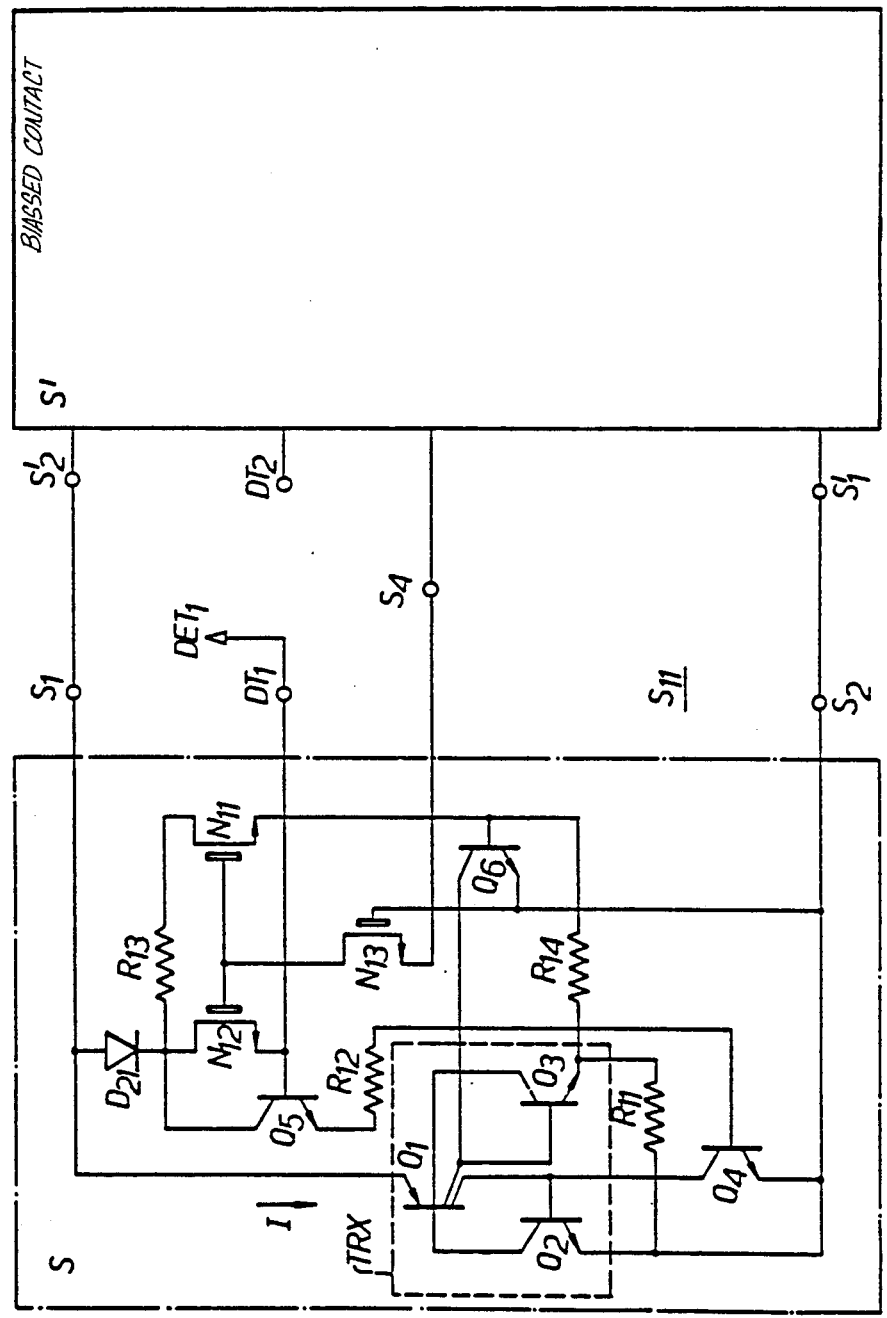
Figure 12:
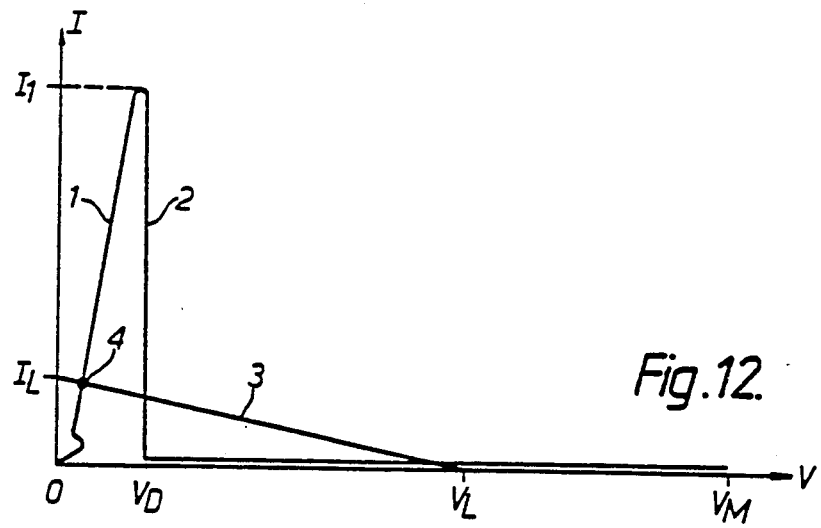
Figure 13:
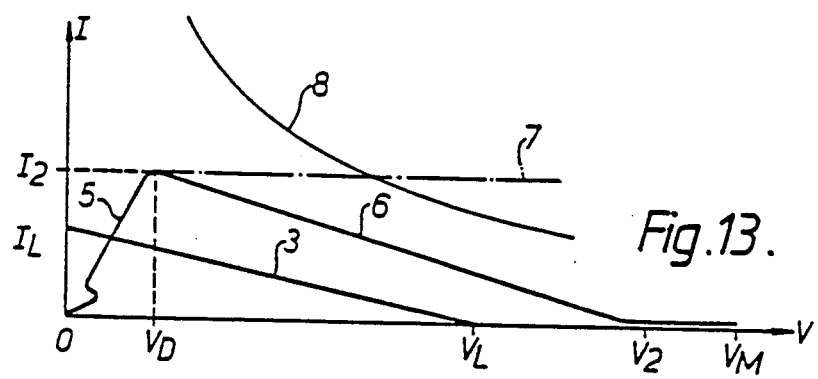
Figure 14:
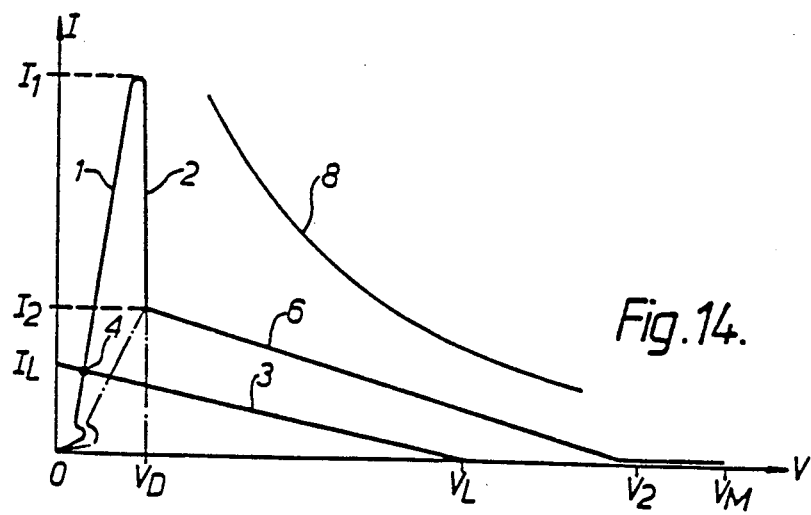
Figure 15:
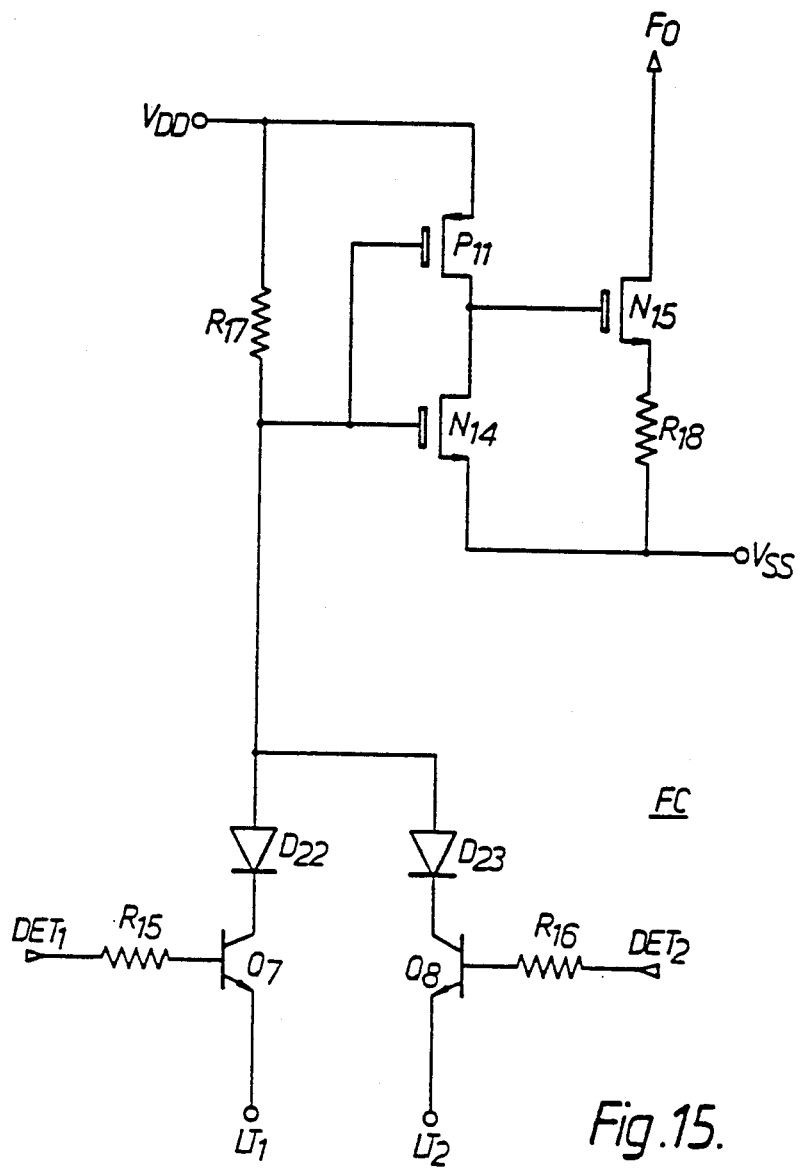

The invention will be best understood and other characteristics thereof appearing in the claims will be better outlined from the following detailed description of preferred embodiments to be read in conjunction with the drawings accompanying the description and which represent:

FIG. 1, the circuit of an electronic contact in accordance with the invention;

FIG. 2, the electronic contact control circuit of the above mentioned patent and modified in accordance with the invention;

FIG. 3, that part of a telephone line circuit incorporating eight electronic contacts in accordance with the invention;

FIG. 4, the whole of the circuits enabling to control the eight electronic contacts and shown solely in the form of a single block in FIG. 3;

FIG. 5, an input protection circuit shown as a block in FIG. 4;

FIG. 6, an electronic gate shown as a block in FIG. 4;

FIG. 7, a double electronic gate controlled by clock pulses and shown as a block in FIG. 4;

FIG. 8, the circuit producing the clock pulses and shown as a block in FIG. 4;

FIG. 9, a first logic circuit used to realize the decoder shown as a block in FIG 4; and FIG. 10, a second logic circuit used in this decoder;

FIG. 11, another embodiment of the circuit of an electronic contact of FIG. 1 including power protection circuits according to the invention;

FIGS. 12 and 13, current versus voltage characteristics of the power protection circuits of FIG. 11, the characteristics being not drawn at scale;

FIG. 14, current versus voltage characteristics of the electronic contact shown in FIG. 11, the characteristic being not drawn at scale;

FIG. 15, a fault indication circuit FC associated to the power protection circuits represented in FIG. 11 and also shown in FIG. 3.

The electronic contact able to withstand relatively high tensions and shown in FIG. 1 can be part of an assembly of eight identical electronic contacts (FIG. 3) arranged as four contact pairs, the two contacts of a pair being always simultaneously open or closed, this combination being able to be used in a telephone line circuit and particularly as described in Belgian Pat. No. 896,468. Apart from the eight electronic contacts corresponding to that of FIG. 1 and the eight circuits for such contacts appearing in FIG. 2 which essentially corresponds to the controlled capacitive charge circuit of Belgian Pat. No. 896,388, FIG. 4 represents a decoder able to be activated either by three or by four binary signals. In the first case, the eight possible combinations of the three binary signals are decoded on four output terminals respectively used to control the four pairs of electronic contacts. In the second case, the enabling signal allows this time to the four input binary signals to be respectively applied to the four electronic gates while the same signal inhibits the decoder operation. Additionally, the circuit of FIG. 4 comprises at the decoder output a converter destined to produce appropriate signals for the capacitive charge circuit of FIG. 2 and this with the help of an oscillator producing complementary clock pulses.

The five parts identified above, i.e. the electronic contacts, the control circuit, the decoder, the converter and the clock oscillator can be associated in a same integrated circuit combining a DCMOS low voltage logic and TRIMOS high voltage contacts. The manufacturing technique used can particularly employ the process described in the Belgian Pat. No. 897,139. The whole then provides four pairs of electronic contacts able to block in the two directions voltages of 300 Volts and having a dynamic resistance of 10 Ohms when they are conductive, the two terminals of each electronic contact floating with respect to the control circuit. The four contact pairs can be operated in accordance with the 16 possible combinations with the help of four binary signals or in accordance with eight predetermined conditions with the help of three binary signals.

By returning to FIG. 1, it is seen that the electronic contact comprises two identical parts S and S' in such a way that only the first has been represented in detail. In function of the control signal, circuit S can present either a low or a high impedance between its two output terminals $S_1$ and $S_2$ to which are respectively connected the corresponding terminals $S'_2$ and $S'_1$ of S', the two circuits being thus connected in anti-shunt. This enables to operated them under three different conditions: both S and S' present a high impedance between their terminals, S presents a low impedance for one voltage polarity at the terminals of the contact while S' can also present this low impedance but for the other polarity.

Circuit S is of the TRIMOS type constituted essentially by a transistor $T_1$ of the PNP type associated to a transistor $T_2$ of the NPN type so as to form a thyristor between terminals $S_1$ and $S_2$. Manufacture of such a device generally entails the appearance of a parasitic transistor $T_3$ of the PNP type which is connected in parallel with the first two. This thyristor combination is controlled by transistor N of the DMOS type associated to transistor P of the PMOS type and whose gates interconnected at the same terminal $S_4$ present a capacitance C towards terminal $S_2$ of the contact to which the drain of transistor P and the source of transistor N are connected.

In this way, assuming that capacitance C has been charged positively at its terminal connected to the two gates of transistors P and N with respect to terminal $S_2$, and that on the other hand the voltage on terminal $S_1$ is more positive than that on $S_2$, transistor N becomes conductive which enables a current to flow from terminal $S_1$ towards terminal $S_2$ through transistor $T_1$ due to transistor N short-circuiting by its drain/source path the base of transistor $T_1$ to which this drain is connected, the emitter of $T_1$ being connected to $S_1$. The effect of this conductibility of $T_1$ is to pump current into the base of transistor $T_2$ which is directly connected to the collector of $T_1$ in such a way that $T_2$ which is of the NPN type begins to pump current into the base of $T_1$ which is directly connected to the collector of $T_2$ whose emitter is directly connected to $S_2$. In this way, by this cumulative action, the two transistors $T_1$ and $T_2$ are placed into a saturation mode offering a low impedance between $S_1$ and $S_2$. Transistor $T_3$ which is also of the PNP type as $T_1$, the basis and the emitter of these two transistors being respectively interconnected while the collector of $T_3$ is at the potential of $S_2$, becomes also conductive but as indicated, this concerns a parasitic element without influence on the main operation of the circuit.

The biassed contact S offering a low resistance between $S_1$ and $S_2$ can now be put back into its high impedance condition with the help of a negative charge on capacitance C, this negative potential at the gates of transistors P and N with respect to $S_2$ now entailing conduction of transistor P which is of the PMOS type. While transistor N of the NMOS type has its drain connected to the base of $T_1$, the source of P is connected to the collector of $T_1$ is such a way that P draws current from the $T_1$ collector so that the $T_2$ base current become insufficient to maintain conductibility of this NPN transistor which, by cumulative effect, entails its blocking and that of $T_1$ and $T_3$, thyristor $T_↓$ becoming non conductive. It will still be noted from FIG. 1 that the P and N substrates are connected to the N drain and to the P source respectively.

The other S' contact shown solely in the form of a block in FIG. 1 operates exactly in the way described but this time under the control of a positive or negative charge on capacitance C' and more particularly at its terminal $S_4$ with respect to its terminal $S'_2$. But these operations of half contact S' will this time be produced when the polarity of the circuit in which the switches are inserted in anti-shunt is positive in $S'_1$ with respect to $S'_2$. To be noted that the relatization of S/S' in a single integrated circuit entails a connection between the common base of $T_1$ and $T_3$ for the two contacts S and S'.

As already indicated in Belgian Pat. No. 896,388, capacitances such as C and C' can be constituted by parasitic capacitances, particularly those appearing at the gates of transistors P and N in the case of capacitance C. Both C and C' can be charged with a desired polarity by way of the control circuit shown in FIG. 2 and corresponding essentially to a version already described in the Belgian patent last mentioned.

Indeed, transistors NA and NB which are both of the NMOS type are shown in FIG. 1 as having their sources directly connected to terminal $S_3$ while the drains of NA and NB are respectively connected to $S_1$ and $S_2$. On the other hand, the gate of NA is connected to $S_2$ while that of NB is connected to $S_1$. Such a circuit arrangement has as a consequence that if the potential of $S_1$ for instance is higher than that of $S_2$, that of $S_3$ cannot be outside this range and transistors NB and NA are conductive and blocked respectively which implies in fact that terminal $S_3$ is practically (0.7 Volt) connected to terminal $S_2$ and by referring to FIG. 2 it is seen that it is in fact capacitance C which is effectively connected between terminals $S_4$ and $S_3$ of the charging device shown in FIG. 2. The parasitic diodes between the source and the drain of transistors NA and NB, i.e. DA and DB such as shown in FIG. 1, are biassed in such a way that they play an analogous role by enabling terminal $S_3$ to align itself on the potential at terminal $S_2$ when the latter is less positive than that at terminal $S_1$.

Of course, in view of the symmetry of the circuit constituted by transistors NA and NB, when the potential of $S_2$ is higher than that of $S_1$, the conditions are inversed and following the conductability of NA or DA, terminal $S_3$ is this time practically connected to terminal $S'_2$ in such a way that in these circumstances it is capacitance C' which is effectively connected to output terminals $S_4$ and $S_3$ of the control circuit of FIG. 2.

In this manner, a single control circuit can automatically close or open the half electronic contact S or S' depending on the polarity of the voltage applied between terminals $S_1/S'_2$ on the one hand and $S_2/S'_1$ on the other.

As already indicated, the circuit of FIG. 2 is essentially described in Belgian pat. No. 896,388 and particularly in relation to FIG. 6 of this patent which is very similar to FIG. 2. The latter constitues an AC/DC converter in the form of a full wave cascade voltage doubler and fed in push-pull by clock pulses of complementary polarity. The polarity control of the circuit of FIG. 2 is effected by signal $\overline{DC}$ applied to series capacitance $C_3$ while the complementary clock signals $\overline{CL}$ and CL are permanently applied to the two other series input capacitances $C_1$ and $C_2$ respectively. In the same way as for the output capacitance C/C' (FIG. 1) present between terminals $S_4$ and $S_2/S'_2$, the three input capacitances are not necessarily constituted by discrete physical elements. The first voltage doubler rectifier is essentially constituted by a series capacitance $C_1$ followed by the series diode $D_1$, transistor $P_1$ of the PMOS type to reach shunt capacitance C/C' between terminals $S_4$ and $S_3$, the shunt diode of this voltage doubler being $D_2$ connected as indicated between the junction of $C_1$ and $D_1$ on the one hand and that of $C_3$ and of the gate of $P_1$ on the other. When the control potential $\overline{DC}$ applied to series capacitance $C_3$ corresponds to clock pulses CL applied to series capacitance $C_2$, it is the described charging circuit which is effective in ensuring a charge of capacitance C/C' in such a manner that the potential at terminal $S_4$ will be more positive than that at terminal $S_3$.

In the inverse case, when control signal $\overline{DC}$ applied to series capacitance $C_3$ corresponds to clock pulses $\overline{CL}$ permenently applied to series capacitance $C_1$, the output capacitance C/C' whill this time be charged with $S_4$ more negative than $S_3$, the elements of this voltage doubler now effective to negatively charge the shunt output capacitance being $C_2$, $D_3$, $N_1$ and $D_4$, corresponding to $C_1$, $D_1$, $P_1$ and $D_2$ respectively as shown in FIG. 2, transistor $N_1$ being of the NMOS type.

As in Belgian Pat. No. 896,388, the positive charging circuit using the conductibility of transistor $P_1$ is completed by transistor $N_2$ of the NMOS type whose drain is connected to $S_3$ and it source to capacitance $C_2$ by means of the series diode $D_5$, the gate of $N_2$ being connected to $S_4$. This connection thus permits to complete the return circuit for the positive charge by offering a path between the "ground" output terminal $S_3$ and the input "ground" terminal constituted by the right-hand electrode of series capacitance $C_2$. Similarly, upon a negative charge of the output capacitance between $S_4$ and $S_3$, the return path is this time effected by way of transistor $P_2$ of the PMOS type in series with diode $D_6$, these two elements corresponding to $N_2$ and $D_5$ respectively as indicated by the circuit which is practially identical to that of FIG. 6 of Belgian Pat. No. 896,388 to the exception of diodes $D_1$ and $D_3$ which are this time to be found on the source side of transistors $P_1$ and $N_1$ respectively instead of being located on the drain side as in the prior patent. Another version of this circuit shown in FIG. 4 of this prior patent already put diodes $D_1$ and $D_3$ on the side of the sources of transistors $P_1$ and $N_1$, but in this circuit the gates of transistors $P_2$ and $N_2$ were interconnected in another circuit and not connected to the drains of transistors $P_1$ and $N_1$ ($S_4$) in such a way that diodes $D_5$ and $D_6$ were this time on the drain side of transistors $N_2$ and $P_2$. In the version of FIG. 2 on the other hand, the four diodes $D_1$, $D_3$, $D_5$ and $D_6$ are all located on the source side of the transistors to which they are associated in such a way that with the diodes $D_2$, $D_4$ and $D_{10}$, they are all arranged on the side of the three input capacitances $C_{1/2/3}$. This last diode $D_{10}$ directly connects capacitances $C_1$ and $C_3$ in the same manner as in the prior patent and the Zener diodes $D_7$, $D_8$ and $D_9$ respectively in parallel on the output terminals $S_{4/3}$ and the source/drain path of transistors $N_2$ and $P_2$ are also connected in the same manner as previously.

The integrated circuit IC which may incorporate eight electronic contacts as shown in FIG. 1 as well as eight control circuits as represented in FIG. 2, appears in the form of a block in FIG. 3 which essentially corresponds to a part of FIG. 1 of Belgian Pat. No. 896,468 bearing on a line circuit for an electronic telephone system. As shown by FIG. 3, a subscriber line (not shown) can terminate on terminals $LT_1$ and $LT_2$, preferably through an overvoltage protection circuit such as that which is the object of Belgian Pat. No. 896,468. By means of the first electronic contact $S_{11}$ part of integrated circuit IC, terminal $LT_1$ can be connected to series resistance $R_1$ and then by means of a second series electronic contact, i.e. $S_21$, to the SLIC circuit containing other elements of the electronic line circuit. The circuit between the second input terminal $LT_2$ and the SLIC circuit is exactly similar, $S_{12}$, $R_2$, $S_{22}$ corresponding to $S_{11}$, $R_1$, $S_{21}$ respectively. In addition to the series contacts enabling to connect the resistances between $LT_1$ and the SLIC circuit, these resistances can also be connected via four shunt contacts towards the test circuits TC ($S_{31}$ for $R_1$ and $S_{32}$ for $R_2$) on the subscriber side ($LT_{1/2}$) on the one hand and towards the ringing circuit RC ($S_{41}$ for $R_1$ and $S_{42}$ for $R_2$) on the exchange side (SLIC) on the other. Connections (not shown) going from the terminals of the feed resistors $R_{1/2}$ to SLIC enable the latter to supervise the potentials appearing across these resistors.

The operation of the eight contacts is controlled from the SLIC through four conductors terminating on terminals $IC_{1/2/3/4}$, the contacts of a pair such as $S_{11/12}$ being controlled by the same signals so that the two wires of the connection are switched simultaneously. The fourth conductor reaching IC$_4$ is however indicated in interrupted lines since this control can be effected in accordance with a control mode using only three binary signals, a mode selection signal applied to terminal IC$_5$ determining if three or four binary signals are used to control the four contact pairs S$_{11/12}$, S$_{21/22}$, S$_{31/32}$ and S$_{41/42}$.

This versatility of the IC circuit is based on the fact that the location of these four contact pairs, directly on each side of resistors R$_1$ and R$_2$ enables to ensure an adequate control with a number of connecting states which does not go beyond eight. Accordingly, when the four contact pairs of circuit IC are used for any application, line circuit or other, necessitating between 9 and 16 possible conditions for the combination of these 4 pairs in their open or closed conditions, each of the four binary signals at terminals IC$_{1/2/3/4}$ can directly control the state of a pair of contacts. On the other hand particularly in the case of the telecommunication line circuit which will be described further, one may be content with a maximum of eight conditions and the selection signal at terminal IC$_5$ will this time indicate that only the three binary signals at terminals IC$_{1/2/3}$ must be taken into consideration and the eight possible combinations of these signals will be transformed with the help of a decoder DEC into four binary signals each of which can control a pair of contacts.

This appears in the form of a block in FIG. 4 which represents the constituting elements of circuit IC of FIG. 3, except the electronic contacts and their capacitive charge control circuits already described in relation to FIGS. 1 and 2 respectively.

In FIG. 4, each of the inputs IC$_{1/2/3/4/5}$ is coupled to the input of a corresponding inverter IV$_{1/2/3/4/5}$ and except in the case of IC$_5$ where the connection is direct, through identical protection circuit PC$_{1/2/3/4}$, the PC$_1$ circuit being detailed in FIG. 5.

The latter shows that input terminal IC$_1$ is directly connected to output terminal A, the input binary code for IC being identified by ABCD, the output terminals B, C, D corresponding to terminals IC$_{2/3/4}$ respectively. Input terminal IC$_1$ is connected to poles V$_1$ and V$_2$ of a DC source through diodes D$_{11}$ and D$_{12}$ respectively, these limiting the potential on IC$_1$/A between those applied in V$_1$ and V$_2$, this last potential, 0 Volt for instance, being more negative than that of V$_1$, 15 Volts for instance. On the other hand, transistor P$_3$ of the PMOS type has its source connected to V$_1$, its drain to A and its gate to V$_2$ in such a way that it is continuously conductive. Transistor T$_4$ shown in interrupted lines as being of the NPN type and having its connector connected to IC$_1$ and its emitter to V$_2$, can be used to bring a binary control signal to IC$_1$. If its base is at the potential of V$_1$, it is conductive and enables the current to pass from V$_1$ to V$_2$ through P$_3$ and T$_4$ in series. The impedance of the latter transistor being lower than that of P$_3$, terminal A stands at the potential of V$_2$. On the other hand, if the base of T$_4$ is at the potential of V$_2$ so as to block T$_4$, terminal A is at the potential of V$_1$ transmitted through P$_3$.

FIG. 4 indicates that the four potentials (ABCD) at the outputs of PC$_{1/2/3/4}$ are applied to terminals such as $\overline{D}$ of a gate GD through inverters such as IV$_4$, in such a way that a complementary binary code $\overline{A}\ \overline{B}\ \overline{C}\ \overline{D}$ appears at the inputs of these gates (gates identical to GD being foreseen for the signals at terminals $\overline{A}$, $\overline{B}$ and $\overline{C}$) with respect to the binary code ABCD at the outputs of PC$_{1/2/3/4}$. Three of these binary signals $\overline{A}\ \overline{B}\ \overline{C}$ are on the other hand applied to decoder DEC, as well as the two signals A and B complementary to $\overline{A}$ and $\overline{B}$ and obtained by inverters IV$_6$ and IV$_7$ in cascade with IV$_1$ and IV$_2$ respectively.

Before explaining with the help of FIGS. 9 and 10 how decoder DEC can advantageously transform the eight combinations of three binary signals ABC into particular combinations of four binary signals at its outputs $\overline{E}\ \overline{F}\ \overline{G}\ \overline{H}$, the description of the other elements of FIG. 14 will be completed, beginning with the above gate GD the output of which is connected to that of an identical gate GH fed by the $\overline{H}$ output of decoder DEC, three identical gates (not shown) being used and connected in like manner to outputs $\overline{E}\ \overline{F}\ \overline{G}$.

Gates such as GD and GH are controlled from terminal IC$_5$ determining the operation mode of IC, with or without decoding by DEC, the binary signal in IC$_5$ being applied to all the gates such as GD/GH as well as the complementary binary signal obtained by inverter IV$_5$.

FIG. 6 shows the circuit of a transmission gate such as GD and GH which connects input terminal $\overline{D}$ or $\overline{H}$ to the output terminal DH by the source/drain path of transistors N$_3$ and P$_4$ connected in anti-shunt and which are of the NMOS and PMOS type respectively. Their gates are connected to IV$_5$ and IC$_5$ respectively for GD and vice versa for GH in such a way that one of these gates is conductive and the other blocked in function of the selection signal of IC$_5$ which does permit to choose for terminals such as DH, either signal $\overline{D}$ and part of a four binary element code each identifying a pair of contacts such as S$_{11/12}$ (FIG. 3), or the signal $\overline{H}$, i.e. one of the four binary elements decoded by DEC from the three binary elements $\overline{A}\ \overline{B}\ \overline{C}$.

As indicated by FIG. 4, the signal at the terminal such as DH must still be synchronized by the gate such as GC with the clock pulses provided by oscillator CO to be applied, as well as the complementary clock signals CL and $\overline{CL}$, to the three input capacitances C$_{1/2/3}$ of the AC/DC push-pull converter (FIG. 2) serving to positively or negatively charge capacitances C/C' controlling the biased electronic contacts S/S' connected in anti-shunt (FIG. 1).

FIG. 7 represents the circuit of the clock gate. The binary signal at the terminal such as DH and determining the open or closed condition of the corresponding contact is this time applied to control gates GCA and GCB identical to those of FIG. 6 but to the inputs of which are applied the complementary clock pulses CL and $\overline{CL}$ used by oscillator CO. Gates GCA and GCB are controlled in complementary fashion by signal DH and its complement produced by inverter IV$_9$ in such a way that the output signal DC from gate GC is either a CL pulse or a complementary $\overline{CL}$ pulse in accordance with the value of the binary signal in DH.

FIG. 8 represents the clock oscillator CO comprising the three inverters IV$_{10/11/12}$ connected in cascade in a loop comprising also the series resistances R$_3$ and R$_4$ on each side of inverter IV$_{11}$, the output of IV$_{12}$ feeding a second series of three inverters IV$_{13/14/15}$ in cascade the last of which provides the clock pulses CL and IV$_{14}$ the complementary pulses $\overline{CL}$. Oscillator CO is also fed by voltages V$_2$ (not shown) and V$_1$, this last being connected to inputs of IV$_{11/12/13}$ through capacitances C$_{4/5/6}$ respectively. These can be of 6 picofarads and $R_3$ of 20 kohms to produce oscillations at a frequency of the order of 1.2 MHz.

As indicated by multiplying arrows in FIG. 4, oscillator CO feeds the four gates such as GC whose output terminal controls two charging circuits such as those of FIG. 2 to control a pair of contacts such as that of FIG. 1. This last connection is performed by inverter $IV_8$ providing the signal $\overline{DC}$ is such a way that the three signals arrive at the capacitance $C_{1/2/3}$ of FIG. 2 through the output impedance of an inverter.

Decoder DEC of FIG. 4 will finally be described by referring also to FIGS. 9 and 10 representing the type of logic circuits advantageously used for its realization.

To this end one will first of all define the eight conditions of a telephone line circuit which can be characterized by a combination of the input signals ABC of the decoder DEC. These eight conditions are identified by the truth table which follows:

|  | A | B | C | Y | $S_{11/12}$ E | $S_{21/22}$ F | $S_{31/32}$ G | $S_{41/42}$ H |
|---|---|---|---|---|---|---|---|---|
| Isolated | 0 | 0 | 0 | 1 | 1 | 1 | 1 | 1 |
| Ringing test | 0 | 0 | 1 | 0 | 1 | 1 | 0 | 0 |
| Ringing supervision | 0 | 1 | 0 | 0 | 0 | 1 | 0 | 0 |
| Ringing | 0 | 1 | 1 | 0 | 0 | 1 | 1 | 0 |
| External test | 1 | 0 | 0 | 1 | 0 | 1 | 0 | 1 |
| Internal test | 1 | 0 | 1 | 0 | 1 | 0 | 0 | 1 |
| Supervision | 1 | 1 | 0 | 0 | 0 | 0 | 0 | 1 |
| Switching through | 1 | 1 | 1 | 0 | 0 | 0 | 1 | 1 |

The table comprises three columns corresponding to the input signals ABC, a fourth column for an intermediate Y signal whose usefulness will appear later, and four other columns $\overline{E}\ \overline{F}\ \overline{G}\ \overline{H}$ defining the signals at the output of decoder DEC, each of these last columns corresponding, as indicated, to the state of a pair of contacts, e.g. $\overline{E}$ for $S_{11/12}$.

The complement bar on top of the references identifying these contacts corresponds to the complementary form of E F G H in such a way that the indication 0 identifies a closed contact for the columns at stake, with 1 for an open contact. The eight conditions for the line circuit appear in the successive rows in increasing order for the binary code from 000 to 111 for ABC, this last code corresponding to the switching through of the line circuit of FIG. 3, i.e. the series contact $S_{11/12}$ and $S_{21/22}$ are closed and the shunt contacts $S_{31/32}$ and $S_{41/42}$ are open. The fourth line gives the code 011 for ABC as ringing condition enabling to connect RC (FIG. 3) towards terminals $LT_{\frac{1}{4}}$ of the subscriber's line through resistors $R_{\frac{1}{4}}$ in such a way that the voltages on the latter can also be used for the supervision of the ringing operation of the called subscriber. The sixth line corresponds to code 101 for ABC and to an internal test (towards the exchange) enabling this time to connect the test bus of TC to the SLIC through resistors $R_{\frac{1}{4}}$. On the other hand, the external test (towards the subscriber) of the fifth line (100 for ABC) produces a connection between TC and terminal $LT_{\frac{1}{4}}$ without passing through the resistors while the ringing test (001 for ABC) interconnects this time RC and TC through the resistors.

Apart from these five conditions, the line circuit still enables complete isolation of the resistors (000 for ABC), ringing supervision (010 for ABC) where TC is additionally branched by $S_{31/32}$ on the above output connection and finally, a supervision (110 for ABC) where TC is also branched but this time on the normal connection.

The eight ABC codes enabling these various conditions have been assigned to the eight contact combinations $S_{11/12}$, $S_{21/22}$, $S_{31/32}$, $S_{41/42}$ as indicated by the table and this to enable as simple a realization as possible for DEC. Indeed, the correspondence table indicates that $\overline{E}=\overline{B}$ and that $\overline{F}=\overline{A}$, except for ABC=100, that G=0 except for ABC=000 and BC=11, and finally that $\overline{H}=A$ except for ABC=000. The realization of decoder DEC is facilitated by these simple correspondence relations and by the introduction of Y=0 except for BC=00, Y being an intermediate binary signal appearing at the fourth column of the table.

Accordingly, one may write the corresponding Boolean relations:

$$\overline{E} = \overline{B}(\overline{A} + C) = \overline{AB} + \overline{BC}$$
$$\overline{F} = \overline{A} + \overline{Y} = \overline{A} + \overline{BC}$$
$$\overline{G} = AY + BC = \overline{ABC} + BC$$
$$\overline{H} = \overline{A} + \overline{Y} = \overline{A} + \overline{BC}$$
$$Y = \overline{BC} \text{ or } \overline{Y} = B + C$$

where the second expression for $\overline{E}$ (FIG. 9) will facilitate a comparison with $\overline{G}$ (FIG. 10) and those for $\overline{F}$, $\overline{G}$ and $\overline{H}$ are obtained by replacing $\overline{Y}$ by the indicated value, that for Y corresponding more directly to the logic circuits used and more precisely a derivation of that of FIG. 10 for $\overline{G}$.

FIG. 9 represents the CMOS logic circuit enabling to realize $\overline{E}$ by using three PMOS transistors connected as indicated between potential $V_1$ and the output terminal giving function $\overline{E}$, as well as three NMOS transistors connected as indicated between the output terminal and the potential $V_2$. The three transistors are identified by the signals $\overline{A}$, $\overline{B}$, $\overline{C}$ applied to their gates, as well for the PMOS as for the NMOS transistors. Their source/drain paths are connected in such a manner that B is in series with a parallel combination $\overline{AC}$ for the PMOS transistors while the duality of the circuit comprising the NMOS transistors implies that B should be in parallel with the series combination $\overline{A}\ \overline{C}$. Hence, signals $\overline{A}$, $\overline{B}$, $\overline{C}$ being respectively the complement of those intervening in the equation giving $\overline{E}$, it is seen in particular that if B is at the low potential, the transistor B among the PMOS transistors is conductive while the corresponding NMOS transistor is blocked. If one forgets transistors $\overline{A}$ and $\overline{C}$ among the PMOS transistors by replacing them by a short circit, while by duality, the NMOS transistors $\overline{A}$ and $\overline{C}$ are replaced by an open circuit, $\overline{E}$ would then be at high potential ($V_1$) which corresponds to $\overline{E}=\overline{B}$, this latter being the first factor of the expression defining E and a condition which, as previously indicated, is true for all the combinations of ABC except 100. But for this last combination, with A and $\overline{C}$ at the high potential and B at the low potential, the PMOS transistors controlled by A and $\overline{C}$ are thus both blocked while the corresponding NMOS transistors are both conductive. For this particular combination, $\overline{E}$ is thus at the low potential ($V_2$) which corresponds to $\overline{E}=B$. For the seven other combinations, these four transistors A and $\overline{C}$ (PMOS and NMOS) are irrelevant because they cannot either short-circuit the blocked transistor B (NMOS) nor put the conductive B transistor (PMOS) in an open circuit in such a way that only B is relevant and that one has $\overline{E}=\overline{B}$.

FIG. 10 represents the circuit enabling to realize $\overline{G}$ following principles identical to what has been outlined for FIG. 9, the second form given above for $\overline{E}$ enabling a direct comparison with the first for $\overline{G}$. Indeed, it is readily seen that there are four independent variables $\overline{A}$, B, C and $\overline{Y}$ for $\overline{G}$ instead of only three (A, B and $\overline{C}$) for $\overline{E}$. In this way, four pairs of PMOS and NMOS transistors connected as indicated are this time necessary and one calls on the intermediate variable Y.

To obtain the latter from B and C, as well as $\overline{F}$ and $\overline{H}$ from $\overline{A}$ and $\overline{Y}$, and from A and $\overline{Y}$ respectively, it suffices each time to take half the circuit of FIG. 10, e.g. transistors $\overline{B}$ and $\overline{C}$, both for the series PMOS transistors and for the shunt NMOS transistors by controlling them by appropriate signals, e.g. B instead of $\overline{B}$ and C instead of $\overline{C}$ to provide Y.

In this manner, the whole of decoder DEC which only calls on the five signals A, $\overline{A}$, B, $\overline{B}$ and C by economizing an inverter for C (FIG. 4), uses only 13 PMOS and 13 NMOS transistors.

Reference is now made to FIG. 11 which shows the electronic contact $S_{11}$ of FIG. 3 in detail, this contact being a modification of the one represented in FIG. 1. While being still of the TRIMOS type, the thyristor TRX formed between the terminals $S_1$ and $S_2$ differs slightly from the one schematically represented in FIG. 1 in that the PNP transistor $T_1$ is now replaced by a PNP transistor $Q_1$ having two distinct collector electrodes respectively connected to the gate electrodes of two NPN transistors $Q_2$ and $Q_3$ substituting the NPN transistor $T_2$, transistor $T_3$ being not represented. Furthermore, individual power protection circuits which are described below in more detail are associated to TRX.

To be noted that contact $S_{12}$ is identical to $S_{11}$ but that the other six contacts do not include power protection circuits. Electronic contacts $S_{11}$ of FIG. 11 includes two identical switching circuits S and S' which are coupled in anti-shunt. More particularly, terminal $S_1$ of S is connected to terminal $S'_2$ of S', whilst terminal $S_2$ of S is connected to terminal $S'_1$ of S'. The control circuit mentioned above is connected to both S and S' via terminal $S_4$. The switching circuits S and S' are also each provided with a detection output terminal $DT_1$, $DT_2$ of which only $DT_1$ is connected to a fault indication circuit FC via detection terminal $DET_1$. FC is also included in the integrated circuit IC and will be described later. Because S and S' are identical only one of them, e.g. S is now considered.

As already mentioned above, transistor $Q_1$ of the thyristor TRX has two distinct collector electrodes connected to the base electrodes of the transistors $Q_2$ and $Q_3$ respectively. The collector electrodes of the transistors $Q_2$ and $Q_3$ are both connected to the base electrode of $Q_1$. Terminal $S_1$ is connected to the emitter electrode of $Q_1$ and terminal $S_2$ is connected to the emitter electrode of $Q_2$ directly and to the emitter electrode of $Q_3$ via a sense resistor $R_{11}$. The base electrode of $Q_2$ is also connected to the collector electrode of an NPN transistor $Q_4$ whose emitter electrode is connected to the terminal $S_2$. Terminal $S_1$ is connected to the base electrode of $Q_4$ via the cascade connection of a diode $D_{21}$, the collector-to-emitter path of an NPN transistor $Q_5$ and resistor $R_{12}$. The cathode of diode $D_{21}$ is also connected to the emitter electrode of $Q_3$ via the series connection of a resistor $R_{13}$, the drain-to-source path of an NMOS transistor $N_{11}$ and a resistor $R_{14}$. The junction point of resistor $R_{14}$ and the source electrode of $N_{11}$ is connected to the base electrode of an NPN transistor $Q_6$ whose collector electrode is connected to the base electrode of $Q_3$ and whose emitter electrode is connected to the terminal $S_2$. The cathode of diode $D_{21}$ is also connected to the drain electrode of an NMOS transistor $N_{12}$ whose source electrode is connected to the base electrode of $Q_5$ together with the detection output terminal $DT_1$. The gate electrodes of $N_{11}$ and $N_{12}$ are both connected to the drain electrode of a DMOS transistor $N_{13}$ having its source electrode connected to the terminal $S_4$ and its gate electrode connected to the terminal $S_2$. To be noted that the DMOS transistor $N_{13}$ has a parasitic diode (not shown) whose anode is connected to the source electrode of $N_{13}$ and whose cathode is connected to the drain electrode of this transistor, and that the NMOS transistors $N_{11}$ and $N_{12}$ have high gate capacitances (not shown).

The thyristor TRX is turned ON and OFF by means of MOS transistors (not shown) corresponding to transistors P and N of FIG. 1, controlled via terminal $S_4$. As already mentioned above, the switching circuit S includes power protection circuits which are also able to control TRX and the functioning of which will be described in detail hereinafter.

The thyristor TRX is associated to two distinct power protection circuits, called primary and secondary power protection circuits respectively. The primary power protection circuit comprises the components $D_{21}$, $N_{12}$, $Q_5$, $R_{12}$ and $Q_4$, and more particularly limits the current through TRX when the voltage across the circuit S exceeds a predetermined value. The secondary power protection circuit comprises the components $D_{21}$, $R_{13}$, $N_{11}$, $Q_6$, $R_{14}$ and $R_{11}$. To be noted that in the following description of the operation of the protection circuits is is assumed that the voltage at terminal $S_1$ is positive with respect to the one at terminal $S_2$ so that diode $D_{21}$ is forwardly biased. The same functioning is valid for S' in case the voltage at $S'_2$ is positive with respect to the one at $S'_1$.

The primary and secondary protection circuits are brought into and out of service by the respective NMOS transistors $N_{11}$ and $N_{12}$ which are themselves controlled by DMOS transistor $N_{13}$. When the thyristor TRX is in the ON-state, a positive control voltage of about +20 Volts applied to terminal $S_4$ is transmitted to the gate electrodes of $N_{11}$ and $N_{12}$ via the parasitic diode of transistor $N_{13}$. As a result, the transistors $N_{11}$ and $N_{12}$ are conductive and the protection circuits are in service. To turn OFF the thyristor TRX, the control voltage as $S_4$ is decreased from its positive value of about +20 Volts to a negative value of about −20 Volts. During this voltage transition, TRX turns OFF when the voltage at $S_4$ reaches about −3 Volts, whilst the protection circuits remain in service even when the parasitic diode of the DMOS transistor $N_{13}$ is blocked. Indeed, the NMOS transistors are then still conductive due to the positive voltage latched by their gate capacitance. When the voltage at $S_4$ reaches about −8 Volts transistor $N_{13}$ becomes conductive so that this negative control voltage is applied to the gate electrodes of $N_{11}$ and $N_{12}$ and blocks them. The power protection circuits are then out of service. The transistor $N_{13}$ coupled to the gate capacitances of the transistors $N_{11}$ and $N_{12}$ thus constitutes a delay circuit which brings the protection circuits out of service a time interval after the blocking of TRX. Thus the protection of this device remains operative a long as TRX is in the ON-state.

When TRX is in the ON-state, no current flows through the primary power protection circuit as long as the voltage across the switching circuit S does not exceed about three diode voltage drops. These three diodes are the diode $D_{21}$, the base-to-emitter path of transistor $Q_5$ and the base-to-emitter path of transistor $Q_4$. To be noted that the current flowing through the primary power protection circuit is so small that the voltage drop across resistor $R_{12}$ is negligible and that the voltage drop across the drain-to-source paths of conductive transistor $N_{12}$ is also negligible since this latter voltage drop is proportional to the base current of transistor $Q_5$ which is still blocked. When the voltage across S increases, transistor $Q_4$ becomes conductive and the collector current of $Q_1$ is drained from the base electrode of $Q_2$ to the terminal $S_2$. As the base current of transistor $Q_2$ is reduced, its collector current and, consequently, the base current of transistor $Q_1$ are also reduced. As a result, the portion $Q_1/Q_2$ of the thyristor TRX turns OFF whilst its portion $Q_1/Q_3$ may remain turned ON as will be described later. During the above operation the main current in the transistor $Q_4$ is limited by resistor $R_{12}$ and transistor $Q_5$ which is itself controlled by transistor $N_{12}$.

Considering only the portion $Q_1/Q_2$ of the thyristor TRX, the current versus voltage characteristic of the switching circuit S would be the one represented in FIG. 12 where part 1 is the normal I/V characteristic of the forwardly biased thyristor TRX. As shown, the voltage V rises to a maximum voltage $V_D$ equal to the above mentioned three diode voltage drops ($\pm 2,1$ Volts) and corresponding to a maximum current $I_1$ of 320 milli-amperes. From the above it follows that, transistor $Q_4$ becomes active at the maximum voltage $V_D$ corresponding to the current $I_1$ so that TRX turns OFF following part 2 of the I/V characteristic shown in FIG. 12. The current in the thyristor TRX and therefore in the switching circuit S is then substantially equal to zero whatever the voltage across this circuit may be so that I/V characteristic then nearly coincides with the voltage axis for voltages exceeding $V_D$. To be noted that this I/V characteristic is valid for the thyristor TRX as well as for the switching circuit S.

The DC load line 3 of the switching device S is also represented in the diagram of FIG. 12. It is defined by two points corresponding respectively to the maximum current $I_L$ (70 milli-amperes) in the telecommunication line when the latter is short-circuited and to the maximum voltage $V_L$ (70 Volts) when this line is open. This DC load line 3 crosses part 1 of the I/V characteristic of the switching circuit S at a stable working point 4.

When unwanted abnormal signals are applied to the telecommunication line they are added to the normal signals generated by the telecommunication exchange so that the load line moves in the I/V diagram of FIG. 12. Such abnormal signals may have various origins like lightning striking the telecommunication line or main power supply accidentally connected to these lines. The working point then moves along part 1 of the IV characteristic. When these unwanted abnormal signals become very large, the load line could be displaced in such a way that the working point reaches the upper end of part 1 of the I/V characteristic. This working point then becomes unstable and moves to higher voltages whilst the TRX turns OFF (part 2). However, the maximum voltage $V_M$ across the switching circuit S is limited to about 250 Volts by the overvoltage protection circuit (not shown) mentioned above so that the working point is then located at point $V_M$ on the voltage axis.

When the abnormal signals disappear the DC load line shifts back into the position drawn in FIG. 12 and the working point moves from $V_M$ (250 Volts) to $V_L$ (70 Volts) where the part of the IV characteristic of TRX which coincides with the voltage axis crosses the DC load line 3. The working point thus becomes stable at that voltage $V_L$ and since the primary power protection circuit is then still active, it is impossible to turn ON the thyristor TRX. To allow TRX to be turned ON again, the part 2 and the part of an I/V characteristic of the switching circuit S coinciding with the voltage axis should not cross the DC load line 3 so that no stable working point such as $V_L$ should exist between $V_M$ and the normal working point 4. A solution is to use the secondary power protection circuit described hereinafter.

Considering only this secondary power protection circuit, when the switching circuit S is in the ON state a current flows from $S_1$ and $S_2$ (FIG. 11) not only via TRX but also via diode $D_{21}$, resistor $R_{13}$, drain-to-source path of NMOS transistor $N_{11}$ and resistors $R_{14}$ and $R_{11}$ in series. As long as the voltage between the terminals $S_1$ and $S_2$ is relatively so small that the voltage drop produced by the above currents across $R_{11}$ and $R_{14}$ in series is smaller than the base-to-emitter saturation voltage $V_{BE}$ of $Q_6$ the latter remains blocked. The current I flowing through TRX then varies in function of the voltage V measured across the switching circuit S according to part 5 of the I/V characteristic shown in FIG. 13. To be noted that due to the values of the resistors which will be given later the current I (FIG. 11) flowing through TRX is much larger than the current flowing through the secondary protection circuit. Hence, the current I may be considered to be the current flowing through the switching circuit S and, as for FIG. 12, the I/V characteristic of FIG. 13 is valid for the thyristor TRX as well as for the switching circuit S. When the voltage between the terminals $S_1$ and $S_2$ is so large that the voltage driop produced across $R_{11}$ and $R_{14}$ in series by the above mentioned currents becomes larger than $V_{BE}$ of $Q_6$, the latter becomes conductive and thereby forms a shunt path to $S_1$ for the collector current of $Q_1$. Thus the base current of $Q_3$ is reduced as a result of which the impedance of TRX increases so that the current I flowing through it varies in function of V in the way represented by part 6 of the I/V characteristic of FIG. 13. This variation is function of the power dissipated in TRX because the voltage drop developped across the switching circuit S not only depends on I because $R_{11}$ is connected in series with TRX but also on V since an additional current which is function of V flows through $R_{11}$ via $R_{13}$ and $R_{14}$. Without $R_{13}$ and $R_{14}$ the current I would remain constant and the equal to the maximum current $I_2$ as shown by part 7 of the I/V characteristic of FIG. 13. In that case the power dissipated in the switching circuit S may become excessive since part 7 crosses the line of maximum power dissipation 8 of the circuit S. For the reasons mentioned above, part 6 of the I/V characteristic should not cross the DC load line 3. On the other hand, because the minimum power dissipated in the switching circuit occurs in the working point of this circuit, i.e. in the crosspoint of part 5 of the I/V characteristic and the DC load line 3, part 6 of the I/V characteristic should be chosen as close as possible to the DC load line 3 in order to obtain a minimum of power dissipation in the switching circuit S. Therefore, the slope of part 6 of the I/V characteristic is chosen similar to the slope of the DC load line 3. This slope is function of the ratio $R_3/R_4$. Indeed, when $Q_6$ starts conducting, its base-to-emitter saturation voltage $V_{BE}$ may be defined by the following expression:

$$\frac{V - R_{11} \cdot I}{R_{11} + R_{14} + R_{13}} = \frac{V_{BE} - R_{11} \cdot I}{R_{11} + R_{14}}$$

Where V and I are the voltage across the current flowing through the switching circuit S respectively. This expression immediately leads to $$I \cdot R_{11} \cdot R_{13} = V_{BE}(R_{11}+R_{14}+R_{13}) - V(R_{11}+R_{14})$$

according to the values of the resistances which are
$R_{11} = 7.6$ ohms
$R_{12} = 500$ ohms
$R_{13} = 145$ Kilo-ohms
$R_{14} = 1$ Kilo-ohms
the following assumptions can be made $R_{13} > > R_{14} > > R_{11}$ the final expression is $$I \cdot R_{11} \cdot R_{13} = V_{BE} \cdot R_{13} - V \cdot R_{14}$$

so that $$I = \frac{1}{R_{11}} \left( V_{BE} - \frac{R_{14}}{R_{13}} \cdot V \right)$$

It appears clearly from this expression that the current I is dependent on the voltage $$\frac{R_{14}}{R_{13}} \cdot V.$$

Since part 6 of the I/V characteristic is chosen as close as possible to the DC load line 3 in order to limit the power dissipated in the switching circuit S the maximum current $I_2$ must be chosen slightly above $I_L$ and the maximum voltage $V_2$ must be chosen slightly above $V_L$. In the present example and with the values of the resistors given above $I_2 = 100$ milli-amperes and $V_2 = 100$ Volts approximatively. However, according to requirements which are conventional for a telecommunication system the protection circuit should be activated for a current exceeding 300 milli-amperes. If, for this reason $I_2$ is chosen higher than the required 300 milli-amperes part 6 of the characteristic should be shifted up and a portion of it may be located above the line of maximum power dissipation 8. In that case, when the power protection circuit becomes active, the power dissipated in S may be so large that the latter is destroyed.

The drawbacks of the two power protection circuits taken separately may be eliminated by combining these two circuits, this combination providing the overall I/V characteristic of the switching circuit S represented in FIG. 14. This characteristic has part 1 and partially part 2 of the I/V characteristic related to the primary power protection circuit, and part 6 of the I/V characteristic related to the secondary power protection circuit. From this figure it appears clearly that the I/V characteristic crosses the above mentioned DC load line 3 at a unique stable working point 4 and that the power dissipated in the switching circuit S is reduced to its minimum since part 6 is very close to the DC load line 3.

A fault indication circuit FC is shown in FIG. 15, FC has input terminals $DET_1$ and $DET_2$, terminals $LT_1$ and $LT_2$, output terminal $F_0$ and power supply terminals $V_{DD}$ ($-33$ Volts) and $V_{SS}$ ($-48$ Volts). The fault indication circuit FC is only associated to the protection circuit S of the switching unit $S_{11}$ (FIG. 11) and to the corresponding protection circuit of the switching unit $S_{12}$ (not shown). This is sufficient to detect abnormal signals of any polarity on the telecommunication line loop connected between $LT_1$ and $LT_2$.

Input terminal $DET_1$ of FC is connected to the like named detection output terminal of the protection circuit S of the switching unit $S_{11}$ (FIG. 11), whilst input terminal $DET_2$ of FC is connected to the detection output terminal of the protection circuit corresponding to S of the switching unit $S_{12}$ (not shown). The terminals $LT_1$ and $LT_2$ of the fault indication circuit FC are respectively connected to the like named line terminals of the subscriber line. The output terminal $F_0$ of the fault indication circuit FC is connected to a digital signal processor or DSP circuit (not shown) which forms also part of the telecommunication line circuit.

The fault indication circuit FC includes an NPN transistor $Q_7$ whose base electrode is connected to input terminal $DET_1$ via a resistor $R_{15}$ and whose emitter electrode is connected to terminal $LT_1$. The supply terminal $V_{DD}$ is connected to the collector electrode of $Q_7$ via resistor $R_{17}$ and diode $D_{22}$ connected in series. Another NPN transistor $Q_8$ has its base electrode connected to input terminal $DET_2$ via a resistor $R_{16}$ and its emitter electrode connected to terminal $LT_2$, whilst the junction point of resistor $R_{17}$ and diode $D_{22}$ is connected to the collector electrode of $Q_8$ via diode $D_{23}$. This junction point is also connected to the gate electrodes of an NMOS transistor $N_{14}$ and of a PMOS transistor $P_{11}$, the source electrode of $P_{11}$ being connected to $V_{DD}$ and the source electrode of $N_{14}$ being connected to $V_{SS}$. The drain electrodes of $P_{11}$ and $N_{14}$ are both connected to the gate electrode of an NMOS transistor $N_{15}$ whose source electrode is connected to $V_{SS}$ via a resistor $R_{18}$. Output terminal $F_0$ is directly connected to the drain electrode of transistor $N_{15}$.

The fault indication circuit FC works as follows. When no abnormal signal is detected by the power protection circuits of the switching circuits S of $S_{11}$ and $S_{12}$ or when these power protection circuits are out of service, the voltage at the input terminals $DET_1$ and $DET_2$ is not sufficiently positive, with regard to the respective terminals $LT_1$ and $LT_2$, to make their associated transistors $Q_7$ and $Q_8$ conductive. No current then flows through the diodes $D_{22}$ and $D_{23}$ and, consequently, through the resistor $R_{17}$ so that the voltage ($V_{DD}$) applied to the gate electrode of $N_{14}$ is more positive than the voltage ($V_{SS}$) at its source electrode. Transistor $N_{14}$ is thus conductive, whilst transistor $P_{11}$ is blocked since it has the same voltage ($V_{DD}$) at its source and gate electrodes. As a result, transistor $N_{15}$ is also blocked and no signal is transmitted to the output terminal $F_0$. Alternatively, when an abnormal signal is detected by the power protection circuits of a switching circuit S a voltage, positive with respect to the one at terminal $LT_1$ ($LT_2$), appears at the input terminal $DET_1$ ($DET_2$) of FC. To be noted that the voltage at terminal $LT_1$ ($LT_2$) is more negative than the voltage at terminal $V_{DD}$. The transistor $Q_7$ ($Q_8$) then becomes conductive and a current can flow from $V_{DD}$ to $LT_1$ (LT$_2$) via resistor R$_{17}$, diode D$_{22}$ (D$_{23}$) and the collector-to-emitter path of transistor Q$_7$ (Q$_8$). As a consequence, transistor N$_{14}$ blocks and transistor P$_{11}$ becomes conductive so that the voltage V$_{DD}$ appears at the gate electrode of transistor N$_{15}$ which becomes also conductive. The circuit N$_{15}$/R$_{18}$ then generates a current which is transmitted via terminal F$_0$ to the DSP circuit, the latter being able to take the appropriate actions.

While the principles of the invention have been described above in connection with specific apparatus, it is to be clearly understood that this description is made only by way of example and not as a limitation on the scope of the invention.

We claim:

1. An electronic switching device comprising:
   a primary electronic contact to selectively establish a low impedance between a first terminal and a second terminal to an external signal having a positive voltage polarity from said first terminal to said second terminal in response to a first state of a primary control signal across said second terminal and a third terminal;
   a circuit for providing an incoming control signal across said third terminal and a fourth terminal;
   a first auxiliary electronic contact to establish a high or low first control impedance between the first and the fourth terminals in response respectively to said positive voltage polarity or a negative voltage polarity from said first terminal to said second terminal;
   a second auxiliary electronic contact to establish a high or low second control impedance opposite to said first control impedance between the second and the fourth terminals, such that when said first control impedance is high, said second control impedance is low, and vice-versa; and
   a permanent, unswitched electrical contact between said third terminal and said primary electronic contact,
   whereby, when the voltage polarity is positive from said first terminal to said second terminal, the impedance between said first and fourth terminals will be high, the impedance between said second and fourth terminals will be low, and said incoming control signal will be effectively across said second terminal and said third terminal thereby constituting said primary control signal, so that said primary electronic contact will have a low impedance when said incoming control signal assumes said first state, and
   whereby, when the voltage polarity is negative from said first terminal to said second terminal, the impedance between said second and fourth terminals will be hight, the impedance between said first and fourth terminals will be low, and said incoming control signal will be effective across said first terminal and said third terminal.

2. Electronic switching device according to claim 1, further comprising
   a secondary electronic contact to selectively establish, in response to a first state of a secondary control signal across said first and third terminals, a low impedance between said first and second terminals to an external signal having a negative voltage polarity from said first to said second terminals,
   whereby, when the voltage polarity is negative from said first terminal to said second terminal, said incoming control signal will effectively constitute said secondary control signal, so that regardless of the voltage polarity, the impedance between said first and second terminals will be low when said incoming control signal assumes said first state.

3. Electronic switching device according to claim 2, wherein the primary and secondary electronic contacts are identical and connected in anti-parallel fashion.

4. Electronic switching device according to claim 2, wherein said primary electronic contact comprises a biased contact of the thyristor type having two control terminals enabling it to be put selectively into the low or high impedance condition.

5. Electronic switching device according to claim 4, wherein the two control terminals are each connected to the second terminal by one or two MOS transistors, each of said transistors being of complementary polarity, the gates of said transistors being interconnected to said third terminal while the source of one of said transistors and the drain of the other of said transistors are interconnected with the second terminal.

6. Electronic device forming part of a circuit including also a power source and a load, said device having a load line and including means to limit the power dissipation therein, wherein:
   said power limiting means is designed to produce a current versus voltage characteristic for the device, having a current axis, a voltage axis, and an origin at the axes, which, starting from the origin, crosses the load line of the device and thereafter, at approximately the same slope as said load line, slopes towards the voltage axis without again crossing said load line defined by the short-circuit current through the device and the open-circuit voltage across it;
   said device includes switching means able to establish between first and second terminals either a low or high impedance, as defined by a low impedance portion and a high impedance portion of said current versus voltage characteristic, respectively; and
   said power limiting means is coupled to said switching means and comprise first sensing means coupled in series with said switching means, second sensing means coupled in parallel with said switching means and regulation means controlled by said first and said second sensing means and controlling said switching means so as to produce said current versus voltage characteristic.

7. Electronic device according to claim 6 characterized in that said first and second sensing means are connected in series and that said regulation means comprise an active device with an input part coupled across said first sensing means and a portion of said second sensing means, and an output part connected to said switching means.

8. Electronic device according to claim 7 characterized in that said first sensing means comprise a resistor, said second sensing means comprise at least two resistors connected in series and said regulation means comprise a transistor.

9. Electronic device according to claims 6, characterized in that
   said electronic device is a switching device comprising an electronic contact to selectively establish a low or a high impedance to an external signal having a positive voltage polarity from a first to a second terminal in response to the voltage of a control signal from said second to a third terminal;

said switching means is part of said electronic contact and that said power limiting means is coupled to disconnection means controlled by said control signal and able to bring said power limiting means into service and out of service after said switching means has established said high impedance.

10. Electronic device, forming part of a circuit including also a power source and a load, said device having a load line and including first power limiting means to limit the power dissipation therein, wherein:

said first power limiting means is designed to produce a current versus voltage characteristic for the device, having a current axis, a voltage axis and an origin at the axes, which, starting from the origin, crosses the load line of the device and thereafter, at approximately the same slope as said load line, slopes towards the voltage axis without again crossing said load line defined by the short-circuit current through the device and the open-circuit voltage across it; and the part of said current versus voltage characteristic crossing said load line has a first portion extending, for voltages which are relatively much smaller than said open circuit voltage, to a current relatively much larger than said short-circuit current and a second portion joining said first portion to the part of said current versus voltage characteristic which has approximately the same slope as the load line.

11. Electronic device according to claim 10, wherein it further includes second power limiting means comprising sensing means for sensing the voltage across said electronic device and regulation means controlled by said sensing means and controlling a switching means so as to produce said first and second portion of said current versus voltage characteristic.

12. Electronic device according to claim 11, wherein said sensing means and said regulation means comprise a common first active device whose output part is connected to said switching means.

13. Electronic device according to claim 11, wherein said electronic device is a switching device comprising an electronic contact to selectively establish a low or a high impedance to an external signal having a positive voltage polarity from a first to a second terminal in response to the voltage of a control signal from said second to a third terminal;

said switching means is part of said electronic contact and said second power limiting means is coupled to disconnection means controlled by said control signal and able to bring said second power limiting means into service and, after a time interval, out of service after said switching means has established said high impedance.

14. Electronic device according to claim 12, wherein said switching means is constituted by second, third and fourth active devices, first output terminals of the third and fourth active devices are coupled to a control terminal of the second active device, second output terminals of the third and fourth active devices are coupled to said second terminal, a first output terminal of the second active device is coupled to said first terminal and the second active device has two distinct second output terminals coupled to control terminals of the third and the fourth active devices respectively.

15. Electronic device according to claim 14, wherein said second active device is constituted by a PNP transistor whose control, first output and the two second output terminals are base, emitter and two collector electrodes respectively, and said third and fourth active devices are each constituted by an NPN transistor whose control, first output and second output terminals are the base, collector and emitter electrodes respectively.

16. Electronic change-over contact to establish low or high impedances between a first terminal and a third terminal, and between a second terminal and said third terminal, the impedance conditions relative to said third terminal being complementary for the first and the second terminals, wherein the first, second and third terminals are coupled to the source, to the gate and to the drain of a MOS transistor respectively, the polarity of the voltage applied between the first and the second terminals is such that said MOS transistor is continuously conductive, and the second and third terminals are coupled to the emitter and to the collector of a bipolar transistor respectively in such a way that when the bipolar transistor is blocked, a low impedance is obtained between the first and the third terminals while, when the bipolar transistor is conductive, a low impedance is obtained between the second and the third terminals.

17. Controlled capacitive charge circuit comprising a source of push-pull AC signals connected by two serial input capacitances to an input of a rectifying circuit, characterized in that a third series input capacitance, having its input terminal coupled to the said source, has its output terminal also connected to said input of said rectifying circuit which comprises a first and a second part respectively to produce either a first or a second DC output polarity, for charging an output capacitance to a first or a second polarity by control means, in that the first and the second parts of the rectifying circuit are decoupled by first complementary MOS transistors the gates of which are coupled to the third input capacitance and include second MOS transistors respectively complementary to the first complementary MOS transistors, said two complementary transistors in the first and the second part being arranged on both sides of the output capacitance, each of said second transistors having a gate coupled to the drain of the first transistor of the same polarity of said first MOS transistors, sources of two of said first and second MOS transistors of a first polarity being each coupled to a first input capacitance by a diode and the sources of two of said first and second MOS transistors of a second polarity being each coupled to the second input capacitance by a diode.

18. Telecommunication system line circuit comprising a series impedance in each of two line conductors and contacts on each side of these two impedances for selectively connecting terminals of said two impedances to an exchange or a line respectively or alternatively, to auxiliary circuits, wherein said contacts consist of four pairs of electronic contacts, the first connecting the line to the impedances, the second connecting the impedances to the exchange, the third connecting the impedances on the line side to a first auxiliary circuit and the fourth connecting the impedances on the exchange side to a second auxiliary circuit, and the eight electronic contacts are always operated in pairs and are additionally controlled in such a way that only eight combinations among sixteen possible combinations for the four pairs are permitted.

19. Line circuit according to claim 18, wherein the eight closed and open combinations of the four pairs of contacts are defined by the eight binary codes 1111, 1100, 0100, 0110, 0101, 1001, 0001 and 0011 with the first, second, third and fourth digits from the left corresponding to the first, second, third and fourth pairs respectively, and the digits 0 and 1 indicating the closure and the opening of the contact pair respectively.

20. Circuit comprising
a plurality of electronic contacts operated in different combinations by binary control signals at respective control inputs thereof,
a decoder controlled by at least two of a plurality of binary input signals to provide a plurality of binary output signals and
an arrangement of gates for selectively coupling the control inputs either to the plurality of binary output signals from said decoder or to the plurality of binary input signals in response to a selection signal,
whereby the electronic contacts may be controlled either directly by the binary input signals or indirectly through the decoder.

21. Line circuit according to claim 20
wherein said at least two binary input signals may assume eight different possible three bit input binary values 000, 001, 010, 011, 100, 101, 110 and 111 in response to which the decoder respectively outputs eight different four bit binary output values 1111, 1100, 0100, 0110, 0101, 1001, 0001 and 0011.

22. Line circuit according to claim 21, wherein said four bit binary output values are produced as a function of the input binary values by five logic circuits respectively defined by the Boolean equations:

$E = B(A + C)$
$F = A + Y$
$G = AY + BC$
$H = A + Y$
$Y = B + C$ where Y is an intermediate signal, where A, B, and C are each one of said input binary control signals, where $\overline{E}, \overline{F}, \overline{G},$ and $\overline{H}$ are each one of said output binary signals, and where $\overline{A}, \overline{B}$ and $\overline{Y}$ are the complements of A, B and Y respectively.

23. Circuit comprising
a plurality of electronic contacts operated in different combinations by binary control signals at respective control inputs thereof,
a decoder controlled by at least two of a plurality of binary input signals to provide a plurality of binary output signals and
an arrangement of gates for selectively coupling the control inputs either to the plurality of binary output signals from said decoder or to the plurality of binary input signals in response to a selection signal, and for controlling a clock gate which comprises two control gates in such a manner that said clock gate transmits either a clock signal or its complement.

24. Circuit as in claim 23, wherein the clock signal and its complement are produced by a clock oscillator part of the same integrated circuit as the gate arrangement, the decoder, the electronic contacts and their control circuits.

25. Telecommunication system line circuit comprising a series impedance in each of two line conductors and contacts on each side of these two impedances enabling to selectively connect terminals of said impedances to an exchange or a line respectively, characterized in that said contacts comprise two pairs of electronic contacts, a first of said pairs connecting the line to the impedances and a second of said pairs connecting said impedances to the exchange, and that only said first pair of electronic contacts is provided with power limiting means.

26. Telecommunication system line circuit according to claim 25, characterized in that said first pair of electronic contacts is also provided with second power limiting means.

27. Telecommunicatin system line circuit according to claim 25, characterized in that it further includes detection means coupled to said first pair of electronic contacts, said detection means producing a signal indicating that the voltage across at least one of said electronic contacts exceeds a predetermined value.

28. Telecommunication system line circuit according to claims 27, characterized in that said detection means comprises a detection circuit with a first input part coupled to a first biassed contact of the first electronic contact of a first pair, a second input part coupled to said first biassed contact of the second electronic contact of said first pair and an output part connected to an indication circuit also included in said detection means and which provides at an output terminal said indication signal which is a function of the voltage across at least one of said biassed contacts.

29. Telecommunication system line circuit according to claim 28, characterized in that said first and second input parts of said detection circuit are each constituted by the base and emitter electrodes of an NPN transistor respectively coupled between said power limiting means and one of said terminals of said biassed contact, that said output part is constituted by the collector electrodes of said NPN transistors to which a first DC supply terminal is connected via a first resistor in series with respective diodes, that said indication circuit includes a PMOS and a first NMOS transistors whose gate electrodes are both connected to the junction point of said first resistor and said diodes, whose drain electrodes are interconnected and whose source electrodes are respectively connected to said first and a second DC supply terminals, and that said common drain electrodes of said PMOS and first NMOS transistors are connected to the gate electrode of a second NMOS transistor whose source electrode is connected to said second DC supply terminal via a second resistor and whose drain electrode is connected to said output terminal.

30. Telecommunication system line circuit according to claim 29, characterized in that it includes third and fourth additional pairs of electronic contacts, the third pair connecting the impedances on a line side to a first auxiliary 5 circuit and the fourth pair connecting them on an exchange side to a second auxiliary circuit.

* * * * *